United States Patent
Hanaoka et al.

(10) Patent No.: US 8,486,772 B2
(45) Date of Patent: Jul. 16, 2013

(54) METHOD OF MANUFACTURING SOI SUBSTRATE

(75) Inventors: Kazuya Hanaoka, Fujisawa (JP);
Hideki Tsuya, Yokohama (JP);
Masaharu Nagai, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/454,114

(22) Filed: Apr. 24, 2012

(65) Prior Publication Data

US 2012/0208348 A1 Aug. 16, 2012

Related U.S. Application Data

(62) Division of application No. 12/762,675, filed on Apr. 19, 2010, now Pat. No. 8,168,481.

(30) Foreign Application Priority Data

Apr. 22, 2009 (JP) ................................. 2009-104203

(51) Int. Cl.
*H01L 21/00* (2006.01)
*H01L 21/46* (2006.01)
*H01L 21/20* (2006.01)
*H01L 21/461* (2006.01)

(52) U.S. Cl.
USPC ........... 438/149; 438/458; 438/479; 438/725; 257/E21.561; 257/E21.568; 257/E21.57

(58) Field of Classification Search
USPC .......... 438/149, 458, 479, 725; 257/E21.561, 257/E21.568, E21.57
See application file for complete search history.

(56) References Cited

U.S. PATENT DOCUMENTS

| | | | |
|---|---|---|---|
| 4,109,030 A * | 8/1978 | Briska et al. | 438/774 |
| 5,374,564 A | 12/1994 | Bruel | |
| 5,559,043 A | 9/1996 | Bruel | |
| 6,127,702 A | 10/2000 | Yamazaki et al. | |
| 6,139,625 A * | 10/2000 | Tamatsuka et al. | 117/19 |
| 6,162,708 A | 12/2000 | Tamatsuka et al. | |

(Continued)

FOREIGN PATENT DOCUMENTS

| EP | 0955671 A | 11/1999 |
|---|---|---|
| EP | 1156531 A | 11/2001 |

(Continued)

*Primary Examiner* — Charles Garber
*Assistant Examiner* — Ron Pompey
(74) *Attorney, Agent, or Firm* — Eric J. Robinson; Robinson Intellectual Property Law Office, P.C.

(57) ABSTRACT

The method of one embodiment of the present invention includes: a first step of irradiating a bond substrate with ions to form an embrittlement region in the bond substrate; a second step of bonding the bond substrate to a base substrate with an insulating layer therebetween; a third step of splitting the bond substrate at the embrittlement region to form a semiconductor layer over the base substrate with the insulating layer therebetween; and a fourth step of subjecting the bond substrate split at the embrittlement region to a first heat treatment in an argon atmosphere and then a second heat treatment in an atmosphere of a mixture of oxygen and nitrogen to form a reprocessed bond substrate. The reprocessed bond substrate is used again as a bond substrate in the first step.

22 Claims, 5 Drawing Sheets

U.S. PATENT DOCUMENTS

| | | | |
|---|---|---|---|
| 6,271,101 B1 | 8/2001 | Fukunaga | |
| 6,284,628 B1 | 9/2001 | Kuwahara et al. | |
| 6,335,231 B1 | 1/2002 | Yamazaki et al. | |
| 6,380,046 B1 | 4/2002 | Yamazaki | |
| 6,388,652 B1 | 5/2002 | Yamazaki et al. | |
| 6,468,923 B1 | 10/2002 | Yonehara et al. | |
| 6,534,380 B1 | 3/2003 | Yamauchi et al. | |
| 6,566,255 B2 | 5/2003 | Ito | |
| 6,596,610 B1 | 7/2003 | Kuwabara et al. | |
| 6,602,761 B2 | 8/2003 | Fukunaga | |
| 6,656,271 B2 | 12/2003 | Yonehara et al. | |
| 6,686,623 B2 | 2/2004 | Yamazaki | |
| 6,720,640 B2 | 4/2004 | Kuwabara et al. | |
| 6,778,164 B2 | 8/2004 | Yamazaki et al. | |
| 6,803,264 B2 | 10/2004 | Yamazaki et al. | |
| 6,809,370 B1 | 10/2004 | Colombo et al. | |
| 6,875,633 B2 | 4/2005 | Fukunaga | |
| 7,052,978 B2* | 5/2006 | Shaheen et al. | 438/463 |
| 7,119,365 B2 | 10/2006 | Takafuji et al. | |
| 7,176,525 B2 | 2/2007 | Fukunaga | |
| 7,199,024 B2 | 4/2007 | Yamazaki | |
| 7,256,776 B2 | 8/2007 | Yamazaki et al. | |
| 7,405,136 B2 | 7/2008 | Delprat et al. | |
| 7,413,964 B2 | 8/2008 | Reynaud et al. | |
| 7,508,034 B2 | 3/2009 | Takafuji et al. | |
| 7,619,250 B2 | 11/2009 | Takafuji et al. | |
| 2002/0153563 A1* | 10/2002 | Ogura | 257/347 |
| 2003/0068437 A1* | 4/2003 | Nakamura et al. | 427/255.27 |
| 2004/0104424 A1 | 6/2004 | Yamazaki | |
| 2005/0009252 A1 | 1/2005 | Yamazaki et al. | |
| 2005/0042840 A1* | 2/2005 | Aga et al. | 438/458 |
| 2006/0014330 A1* | 1/2006 | Ichikawa et al. | 438/149 |
| 2006/0075957 A1 | 4/2006 | Takano et al. | |
| 2006/0228846 A1 | 10/2006 | Endo et al. | |
| 2007/0108510 A1 | 5/2007 | Fukunaga | |
| 2007/0173000 A1 | 7/2007 | Yamazaki | |
| 2007/0184632 A1 | 8/2007 | Yamazaki et al. | |
| 2007/0291022 A1 | 12/2007 | Yamazaki et al. | |
| 2008/0124929 A1 | 5/2008 | Okuda et al. | |
| 2009/0093102 A1 | 4/2009 | Moriwaka | |
| 2009/0280621 A1* | 11/2009 | Endo et al. | 438/458 |
| 2010/0022070 A1 | 1/2010 | Imahayashi | |

FOREIGN PATENT DOCUMENTS

| | | |
|---|---|---|
| EP | 1791174 A | 5/2007 |
| JP | 05-211128 A | 8/1993 |
| JP | 2000-294754 A | 10/2000 |
| JP | 2000-349266 A | 12/2000 |
| JP | 2004-087606 A | 3/2004 |
| JP | 2004-134675 A | 4/2004 |
| JP | 2005-252244 A | 9/2005 |
| JP | 2007-149907 A | 6/2007 |
| JP | 2007-251129 A | 9/2007 |
| JP | 2007-273977 A | 10/2007 |

* cited by examiner

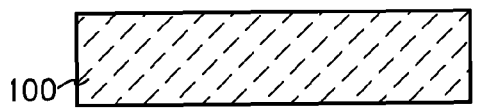
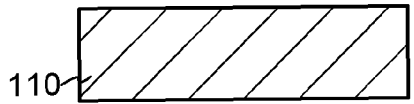
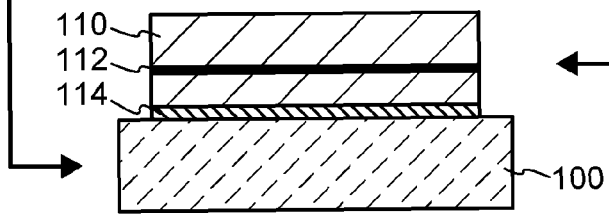
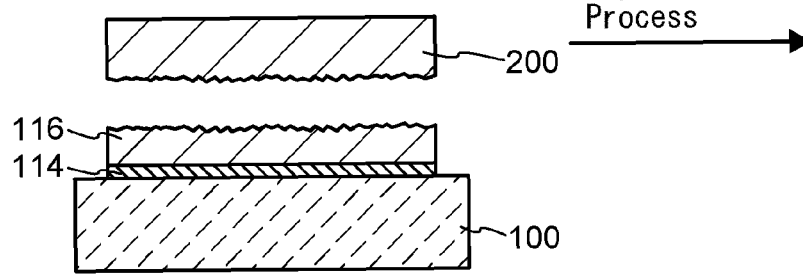
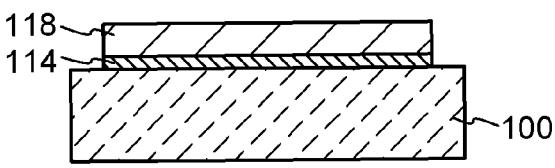

Reprocessing Process

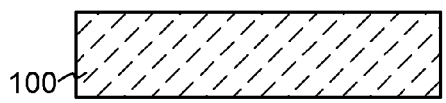
FIG. 5A-1
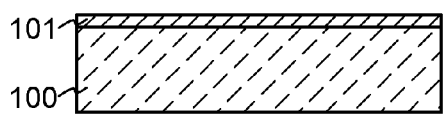
FIG. 5A-2
FIG. 5B-1
FIG. 5B-2
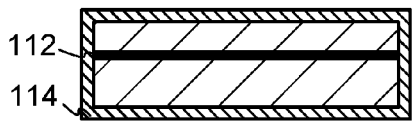
FIG. 5B-3
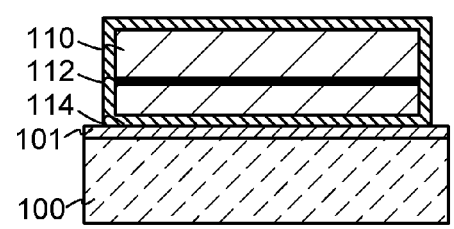
FIG. 5C
Reprocessing Process
FIG. 5D
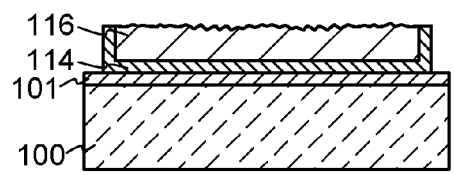
FIG. 5E
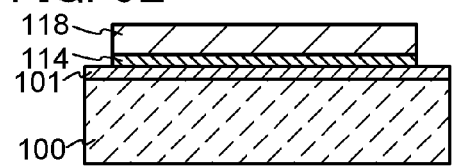

METHOD OF MANUFACTURING SOI SUBSTRATE

BACKGROUND OF THE INVENTION

1. Field of the Invention

The present invention relates to a method of manufacturing a substrate over which a semiconductor layer is provided with an insulating layer therebetween, and particularly relates to a method of manufacturing a silicon on insulator (SOI) substrate. Further, the present invention relates to a method of recycling a bond substrate in the manufacturing method of an SOI substrate.

2. Description of the Related Art

As substrates suitable for manufacture of semiconductor devices that achieve low power consumption and high-speed operation, attention has been directed to SOI substrates in which a semiconductor layer is provided over a base substrate having an insulating surface.

One of known methods of manufacturing an SOI substrate is a hydrogen ion implantation separation method (see Patent Document 1). The hydrogen ion implantation separation method is a technique of forming an SOI substrate in the following manner. An oxide film is formed on one of two silicon wafers which is to serve as a bond substrate. At the same time, by implanting hydrogen ions into the bond substrate, a microbubble layer is formed in the bond substrate. The bond substrate is put in close contact with the other silicon wafer that is to serve as a base substrate, with the oxide film therebetween. Then, by a heat treatment, the bond substrate is split with the use of the microbubble layer as a splitting plane. Another heat treatment on the base substrate side forms a strong bond between the base substrate and a semiconductor layer that is split from the bond substrate. Thus, an SOI substrate is formed.

Furthermore, for an efficient and economical use of silicon wafers, a method by which many SOI substrates can be manufactured with as few silicon wafers as possible has been researched (see Patent Document 2).

REFERENCE

Patent Document

[Patent Document 1] Japanese Published Patent Application No. H5-211128

[Patent Document 2] Japanese Published Patent Application No. 2000-349266

The bond substrate still retains its wafer form after the split. If defects and the like remaining on a surface used for the split are removed by etching, polishing, or the like, the bond substrate can be reused to manufacture another SOI substrate.

Repeated use of a bond substrate in this manner has involved a problem of an increase in oxygen defects such as an oxidation-induced stacking fault (OSF) due to an ion irradiation step, thermal history during split of the bond substrate, or the like. If a bond substrate having an increased number of oxygen defects is used to manufacture an SOI substrate, semiconductor properties significantly deteriorate.

Further, in an ion irradiation step, an impurity element such as a heavy metal which is contained in an electrode, a chamber, or the like could be added to the bond substrate. Like oxygen defects, such an impurity element adversely affects the semiconductor properties.

SUMMARY OF THE INVENTION

In view of the foregoing problems, an object of an embodiment of the disclosed invention is to prevent malfunction of a bond substrate which is caused by its repeated use.

According to an embodiment of the disclosed invention, a bond substrate split in formation of an SOI substrate by ion implantation separation method is subjected to a first heat treatment in an argon atmosphere and then a second heat treatment in an atmosphere of a mixture of oxygen and nitrogen, so that a reprocessed bond substrate is formed and used again as a bond substrate in an ion implantation separation method. This is detailed below.

One embodiment of the present invention is a method of manufacturing an SOI substrate including: a first step of irradiating a bond substrate with accelerated ions to form an embrittlement region in the bond substrate; a second step of bonding the bond substrate to a base substrate with an insulating layer therebetween; a third step of splitting the bond substrate at the embrittlement region to form a semiconductor layer over the base substrate with the insulating layer therebetween; and a fourth step of subjecting the bond substrate split at the embrittlement region to a first heat treatment in an argon atmosphere and then a second heat treatment in an atmosphere of a mixture of oxygen and nitrogen to form a reprocessed bond substrate, in which the reprocessed bond substrate is used again as the bond substrate in the first step.

In the above structure, the fourth step can be performed after the steps from the first step to the third step are repeated n times (n: a natural number greater than or equal to 2). Further, in the above structure, an oxide film formed on a surface of the reprocessed bond substrate in the second heat treatment can be used as the insulating layer in the bond to the base substrate.

Further, the above method may further include the step of polishing a surface of the bond substrate split at the embrittlement region between the third step and the fourth step.

In the above structure, the concentration of the oxygen in the second heat treatment is preferably less than 5 vol. %. Further, the atmosphere during the second heat treatment preferably includes chlorine in addition to oxygen and nitrogen.

Another embodiment of the present invention is a method of manufacturing an SOI substrate which includes: a first step of subjecting a bond substrate to a first heat treatment in an argon atmosphere and then a second heat treatment in an atmosphere of a mixture of oxygen and nitrogen; a second step of irradiating the bond substrate with accelerated ions to form an embrittlement region in the bond substrate; a third step of bonding the bond substrate to a base substrate with an insulating layer therebetween; and a fourth step of splitting the bond substrate at the embrittlement region to form a semiconductor layer over the base substrate with the insulating layer therebetween. After the fourth step is performed once, the steps from the second step to the fourth step are repeated n times (n: a natural number greater than or equal to 2).

Note that in this specification and the like, the term "SOI substrate" is used as a concept also including a substrate provided with a layer of a semiconductor other than silicon. In other words, in this specification and the like, a bond substrate used for manufacture of an SOI substrate includes a substrate other than a substrate formed of a silicon material.

An embodiment of the disclosed invention enables formation of a reprocessed bond substrate with reduced oxygen defects or impurity elements, thereby improving the properties of an SOI substrate manufactured using this reprocessed bond substrate. Further, deterioration of the properties of a bond substrate can be suppressed, and therefore the number of times of repeated use of the bond substrate increases. This can further suppress manufacturing costs of an SOI substrate.

Thus, an embodiment of the disclosed invention can prevent malfunction of the bond substrate which is caused by its repeated use.

BRIEF DESCRIPTION OF THE DRAWINGS

FIGS. 1A to 1E are cross-sectional views illustrating an example of a method of manufacturing an SOI substrate.

FIGS. 5A-1, 5A-2, 5B-1 to 5B-3 and 5C to 5E are cross-sectional views illustrating an example of a method of manufacturing an SOI substrate.

DETAILED DESCRIPTION OF THE INVENTION

Figure 2:
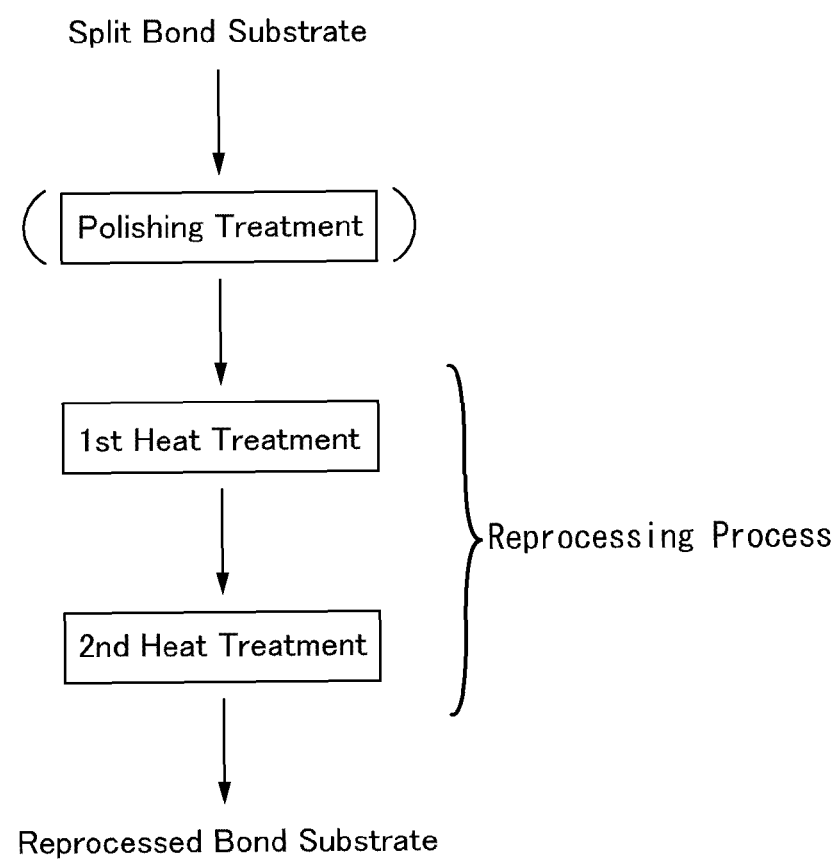
FIG. 2 shows a manufacturing process flow of a reprocessed substrate.

Hereinafter, embodiments are detailed using the accompanying drawings. Note that the invention is not limited to the description below, and it is apparent to those skilled in the art that the embodiments and details thereof can be easily modified in various ways without departing from the spirit of the invention disclosed in this specification and the like. In addition, structures according to different embodiments can be implemented in appropriate combination. Note that throughout the structures of the invention described below, identical parts or parts having similar functions are represented by the same reference numeral, the explanation of which is not repeated.

(Embodiment 1)

In this embodiment, an example of a method of manufacturing an SOI substrate is described with reference to drawings. Specifically, a process of manufacturing an SOI substrate is described using FIGS. 1A to 1E, and Process of Forming Reprocessed Bond Substrate is described using FIG. 2 and FIGS. 3A to 3E.

(Process of Manufacturing SOI Substrate)

First, a base substrate 100 and a bond substrate 110 are prepared (see FIGS. 1A and 1B).

As the base substrate 100, a substrate formed of an insulator can be used. Specific examples thereof include a variety of glass substrates used in the electronics industry, such as substrates of aluminosilicate glass, aluminoborosilicate glass, and barium borosilicate glass, a quartz substrate, a ceramic substrate, and a sapphire substrate. Note that by containing a larger amount of barium oxide (BaO) than the amount of boric acid, a glass substrate as mentioned above has heat resistance such that it is more practicable. Thus, a glass substrate containing a larger amount of BaO than the amount of $B_2O_3$ may preferably be used. Note that in this embodiment, a description is given of the case where a glass substrate is used as the base substrate 100. The use of a glass substrate as the base substrate 100, which realizes a larger size device and inexpensiveness, can reduce costs.

As the bond substrate 110, it is possible to use a single crystal semiconductor substrate formed of a Group 14 element, such as a single crystal silicon substrate, a single crystal germanium substrate, or a single crystal silicon germanium substrate, for example. It is also possible to use a compound semiconductor substrate formed of gallium arsenide, indium phosphide, or the like. As typical commercially available silicon substrates, there are round silicon substrates that are 5 inches (125 mm) in diameter, 6 inches (150 mm) in diameter, 8 inches (200 mm) in diameter, 12 inches (300 mm) in diameter, and 16 inches (400 mm) in diameter. However, the shape of the bond substrate 110 is not limited to a round shape and can be a rectangular shape or the like obtained by processing. Further, the bond substrate 110 can be manufactured by the Czochralski (CZ) method or the floating zone (FZ) method.

Next, an embrittlement region 112 is formed at a certain depth from a surface of the bond substrate 110, and the base substrate 100 and the bond substrate 110 are bonded to each other with an insulating layer 114 therebetween (see FIG. 1C).

In the above step, the bond substrate 110 is irradiated with ions of hydrogen or the like having kinetic energy, whereby the embrittlement region 112 can be formed.

Further, the insulating layer 114 can be formed using a single layer of an insulating layer such as a silicon oxide film, a silicon oxynitride film, a silicon nitride film, or a silicon nitride oxide film, or a stack of any of these films. These films can be formed by a thermal oxidation method, a CVD method, a sputtering method, or the like.

Note that in this specification and the like, the term oxynitride means a substance in which the oxygen content (atoms) exceeds the nitride content (atoms). For example, silicon oxynitride is a substance including oxygen, nitrogen, silicon, and hydrogen at concentrations ranging from 50 to 70 at. %, 0.5 to 15 at. %, 25 to 35 at. %, and 0.1 to 10 at. %, respectively. Further, the term nitride oxide means a substance in which the nitrogen content (atoms) exceeds the oxygen content (atoms). For example, silicon nitride oxide is a substance including oxygen, nitrogen, silicon, and hydrogen at concentrations ranging from 5 to 30 at. %, 20 to 55 at. %, 25 to 35 at. %, and 10 to 30 at. %, respectively. Note that the above ranges are the values obtained by employing Rutherford backscattering spectrometry (RBS) or hydrogen forward scattering (HFS). Further, the total of the constituent element contents does not exceed 100 at. %.

Next, by a heat treatment or the like, the bond substrate 110 is split at the embrittlement region 112 into a semiconductor layer 116 and a split bond substrate 200, whereby the semiconductor layer 116 is formed over the base substrate 100 (see FIG. 1D). The split bond substrate 200 becomes a reprocessed bond substrate through a reprocessing process, and can be reused. Note that since there are defects or the like on a surface of the split bond substrate 200 due to the embrittlement region 112, such defects may preferably be removed before the reprocessing process. Accordingly, the reprocessing process can be carried out more successfully. As methods of the removal, an etching treatment and a polishing treatment such as CMP are possible.

When the heat treatment is performed, the heat treatment allows an added element to be separated out into microvoids formed in the embrittlement region 112, resulting in an increase in the internal pressure of the microvoids. The increase in pressure generates a crack in the embrittlement region 112, whereby the bond substrate 110 is split along the embrittlement region 112. Since the insulating layer 114 is bonded to the base substrate 100, the single crystal semiconductor layer 116 split from the bond substrate 110 remains over the base substrate 100.

After that, by subjecting the semiconductor layer 116 to a surface treatment or the like, a flat semiconductor layer 118 is formed (see FIG. 1E). As the surface treatment, there are an irradiation treatment with laser light, an etching treatment, and a polishing treatment such as CMP, for example.

Through the above process, an SOI substrate in which the semiconductor layer 118 is provided over the base substrate 100 with the insulating layer 114 therebetween can be obtained.

<Process of Forming Reprocessed Bond Substrate>

Next, a process of reprocessing the split bond substrate 200 is described with reference to FIG. 2 and FIGS. 3A to 3E.

As the reprocessing process, the split bond substrate 200 can be subjected to a first heat treatment and a second heat treatment.

The first heat treatment can be performed in an argon atmosphere. The following are possible examples of conditions for the first heat treatment: the atmosphere during the heat treatment is an argon atmosphere in which the proportion of argon in the introduced gas is greater than or equal to 90 vol. % and less than or equal to 100 vol. %; the temperature of the heat treatment is greater than or equal to 1150° C. and less than or equal to 1300° C.; and the time for the heat treatment is greater than or equal to 30 minutes and less than or equal to 960 minutes, or alternatively, greater than or equal to 30 minutes and less than or equal to 240 minutes. Alternatively, the first heat treatment may be carried out in a hydrogen atmosphere or an atmosphere of a mixture of hydrogen and argon. When the atmosphere of a mixture of hydrogen and argon is employed, the proportion of hydrogen in the introduced gas may preferably be 4 vol. %, for example.

By subjecting the split bond substrate 200 to the heat treatment (first heat treatment) in an argon atmosphere, oxygen separated out in the bond substrate 200 is melted and out-diffusion of the oxygen is promoted, so that the oxygen in the bond substrate 200 is reduced. Thus, a zero defect layer (a Denuded Zone (DZ) layer) can be formed. This makes it possible to suppress generation of an oxidation-induced stacking fault (OSF) even when the bond substrate 200 is used repeatedly in a process of manufacturing an SOI substrate.

The second heat treatment can be performed in an atmosphere of a mixture of oxygen and nitrogen. The following are possible examples of conditions for the second heat treatment: the atmosphere during the heat treatment is a mixture atmosphere in which the proportion of oxygen in the introduced gas is 1 to 25 vol. % (preferably, less than 5 vol. %); the temperature of the heat treatment is greater than or equal to 1150° C. and less than or equal to 1300° C.; and the time for the heat treatment is greater than or equal to 30 minutes and less than or equal to 240 minutes. In this case, an oxide film can be formed on a surface of the bond substrate 200. Note that an increase in the proportion of oxygen in the introduced gas tends to hamper removal of oxygen in the bond substrate 200 in exchange for a rise in the growth rate of the oxide film formed on the surface. Further, the oxide film may include nitrogen atoms.

Alternatively, the second heat treatment may be performed in an atmosphere of a mixture of oxygen, nitrogen, and halogen (e.g., fluorine or chlorine). The following are possible examples of conditions for the second heat treatment in this case: the atmosphere during the heat treatment is an atmosphere in which hydrogen chloride (HCl) is introduced into an atmosphere of a mixture of oxygen and nitrogen so that the proportion of HCl is 1 to 10 vol. %; the temperature of the heat treatment is greater than or equal to 1150° C. and less than or equal to 1300° C.; and the time for the heat treatment is greater than or equal to 30 minutes and less than or equal to 240 minutes. In this case, an oxide film including chlorine atoms can be formed on a surface of the bond substrate 200.

By subjecting the bond substrate 200 to the heat treatment (second heat treatment) in an atmosphere of a mixture of oxygen and nitrogen, out-diffusion of oxygen in the bond substrate 200 is promoted, so that the oxygen in the bond substrate 200 can be reduced. Further, the oxide film formed on the surface of the bond substrate 200 through the second heat treatment functions a gettering site for impurity elements (e.g., metal elements such as copper, iron, or nickel, or metal silicides thereof) included in the bond substrate 200. Therefore, the second heat treatment promotes out-diffusion of oxygen in the bond substrate 200 and also can reduce the impurity elements included in the bond substrate 200.

Further, during the second heat treatment in an atmosphere of a mixture of oxygen and nitrogen, by setting the oxygen concentration to less than 5 vol. % in the introduced gas, the out diffusion can be promoted.

Furthermore, when an insulating layer formed on the surface of the bond substrate 200 through the second heat treatment includes chlorine atoms, the effect of fixing impurity elements such as heavy metal in the oxide film can be obtained.

Preferably, as the reprocessing process in this embodiment, the first and second heat treatments are combined as shown in FIG. 2. The effects achieved when the first and second heat treatments are performed in combination are described below.

Figure 3A:
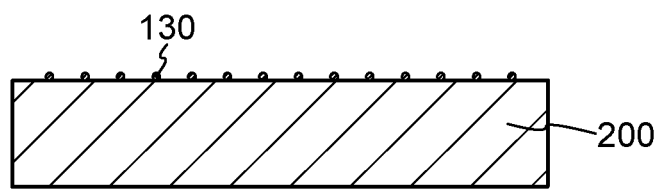
FIGS. 3A to 3E are cross-sectional views illustrating an example of a process of manufacturing a reprocessed substrate.
Figure 3B:
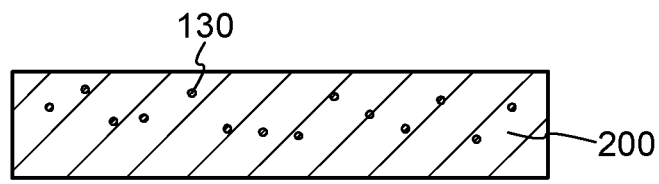
Figure 3C:
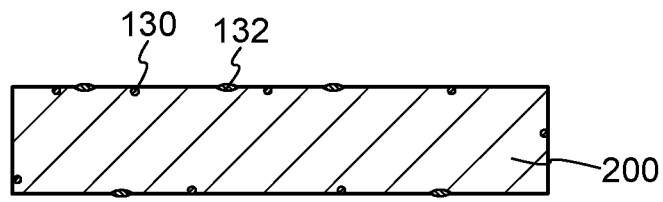

When the heat treatment (first heat treatment) is performed in an argon atmosphere with metal impurities (e.g., metal elements such as copper, iron, or nickel) included in the bond substrate 200 or with metal impurities 130 adhering to the surface of the bond substrate 200 (see FIG. 3A), the heat treatment cause these metal impurities 130 to diffuse throughout the bond substrate 200 (see FIG. 3B). These metal impurities 130 are separated out in the vicinity of the surface of the bond substrate 200 when the bond substrate 200 is cooled. Further, silicides 132 of these metals are formed on the surface of the bond substrate 200 when silicon is used for the bond substrate 200, which is problematic (see FIG. 3C).

Figure 3D:
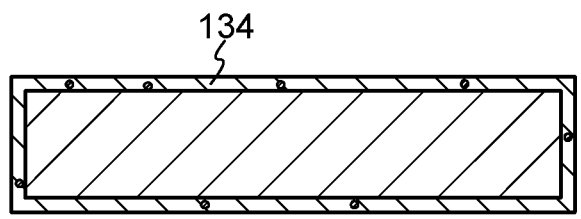
Figure 3E:
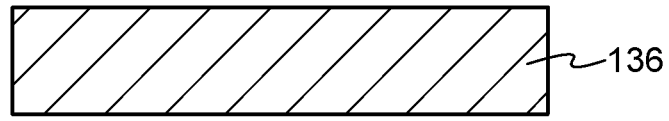

Even in such a case, performing the first and second heat treatments in combination enables the gettering of impurity elements such as metal impurities, which are formed on the surface of the bond substrate 200 and in the vicinity of this surface during the first heat treatment, in an oxide film 134 formed on the surface of the bond substrate 200 during the second treatment (see FIG. 3D). The oxide film 134 is then removed. Thus, a reprocessed bond substrate 136 can be formed (see FIG. 3E).

Note that although FIGS. 3A to 3E illustrate the case where the oxide film 134 formed on the surface of the bond substrate 200 is removed, the oxide film 134 may be used as the insulating layer 114 for the bond to the base substrate 100.

Thus, the combination of the first and second heat treatments enables the second heat treatment to suppress the problem caused by the first heat treatment. The combination of the first and second heat treatments is effective particularly when the split bond substrate 200 is subjected to a polishing treatment because, in this case, there is a high possibility that impurity elements such as metal impurities adhere to the surface of the bond substrate 200.

Further, it is preferable that the second heat treatment be performed after the first heat treatment when they are combined.

This is because, when the heat treatment (second heat treatment) in an atmosphere of a mixture of oxygen and nitrogen is performed in the presence of minute defects due to oxygen in the bond substrate 200, an OSF the core of which is the minute defect is possibly generated in the bond substrate 200.

By performing the heat treatment (first heat treatment) in an argon atmosphere before the heat treatment (second heat treatment) is performed in an atmosphere of a mixture of oxygen and nitrogen, the second heat treatment can be performed in a state where minute defects included in the bond substrate 200 are reduced. Thus, the second heat treatment can suppress the generation of an OSF in the bond substrate 200.

In this manner, performing the second heat treatment after the first heat treatment can suppress the generation of an OSF in the bond substrate 200 and reduce impurity elements included in the bond substrate 200, as well as effectively promote out-diffusion of oxygen in the bond substrate 200.

Further, compared with when impurity elements are removed by polishing the surface of the bond substrate 200 after the heat treatment in an argon atmosphere, the bond substrate 200 can be recycled a larger number of times because of the gettering of the impurity elements, which are formed on the surface of the bond substrate 200 and in the vicinity of this surface during the first heat treatment, by performing the second heat treatment after the first heat treatment. Furthermore, the manufacturing process can be simplified by use of the oxide film 134, which is formed on the surface of the bond substrate 200 during the second heat treatment, as the insulating layer 114 for the bond to the base substrate 100.

As described above, the first and second heat treatments for the split bond substrate 200 enables the formation of a reprocessed bond substrate in which oxygen defects or impurity elements are reduced.

Note that although at least the first and second heat treatments are performed in this embodiment, the present invention is not limited thereto. A polishing treatment may be performed after the second heat treatment or between the first and second heat treatments. Further, when the number of the minute defects due to oxygen in the bond substrate 200 is small, the order of the first and second heat treatments may be reversed, or the first heat treatment may be omitted to perform the second heat treatment alone. Furthermore, when the amount of the metal elements adhering to the bond substrate 200 is small, the second heat treatment may be omitted to perform the first heat treatment alone. When only the first heat treatment is performed, the surface of the bond substrate 200 is preferably subjected to the polishing treatment after the first heat treatment.

<Usage of Reprocessed Bond Substrate>

The reprocessed bond substrate 136 formed as above can be used in the same way as normal bond substrates. In other words, an SOI substrate can be manufactured with use of the reprocessed bond substrate 136 as the bond substrate 110 illustrated in FIGS. 1A to 1E. This can reduce manufacturing costs of an SOI substrate. Refer to the above Process of Manufacturing SOI Substrate for details.

Note that the reprocessed bond substrate 136 obtained by the above reprocessing process can be resistant to a process of manufacturing an SOI substrate plural times because the zero defect layer (DZ layer) is formed even to a certain depth (e.g., 100 μm) from the surface. Therefore, the reprocessing process is preferably performed after the manufacturing process of an SOI substrate is repeated n times (n: a natural number greater than or equal to 2). This can reduce the number of the reprocessing process, which leads to a reduction in manufacturing costs of an SOI substrate and suppression of deterioration (e.g., cracking or chipping) of the bond substrate due to the thermal history.

Further, the second heat treatment in the above reprocessing process is performed in an atmosphere containing oxygen, resulting in the formation of the oxide film 134 on the surface of the reprocessed bond substrate 136, as described above. Therefore, the oxide film 134 may be used as the insulating layer 114 for the bond to the base substrate 100. In this case, the step of forming the insulating layer 114 can be omitted, leading to suppression of the manufacturing costs. It is needless to say that the above oxide film may be removed.

The structure described in this embodiment can be used in appropriate combination with the structures described in other embodiments.

(Embodiment 2)

In this embodiment, another example of the method of manufacturing an SOI substrates is described.

Although the process of reprocessing the split bond substrate is detailed in the above embodiment, an unused bond substrate may be subjected to this reprocessing process. In this case, removal of contaminants in the bond substrate and a reduction in defects are possible, contributing to a further improvement of the properties of a manufactured SOI substrate. Further, since the oxygen in the bond substrate is reduced and the DZ layer can be formed even to a certain depth of the bond substrate, growth of an OSF can be inhibited, and the number of times of repeated use of the bond substrate can be increased compared with a bond substrate that is not subjected to the process. Note that this process does not relate to the reprocess of the bond substrate and therefore can be simply called "heat treatment" or the like instead of "reprocessing process".

Since the details of the heat treatment are the same as those of Process of Forming Reprocessed Bond Substrate in the above embodiment, refer to the corresponding descriptions. Further, as for the manufacture of an SOI substrate with the use of the bond substrate formed by the heat treatment, refer to the descriptions in Process of Manufacturing SOI Substrate.

Note that the bond substrate provided by the above heat treatment can be resistant to the process of manufacturing an SOI substrate plural times. Therefore, it is preferable to perform the reprocessing process after the process of manufacturing an SOI substrate is repeated n times (n: a natural number greater than or equal to 2). Refer to Process of Forming Reprocessed Bond Substrate for the details of the reprocessing process. Also in this case, a reduction in manufacturing costs of an SOI substrate and suppression of deterioration (e.g., cracking or chipping) of the bond substrate which results from the thermal history can be realized.

Further, because the second heat treatment is performed in an atmosphere containing oxygen, the oxide film formed through the treatment may be used as the insulating layer for the bond to the base substrate. In this case, the step of forming the insulating layer can be omitted, leading to the suppression of the manufacturing costs. It is needless to say that the above oxide film may be removed.

Note that the above oxide film may include a halogen element such as chlorine or fluorine. For example, in order that the above oxide film include chlorine, the second heat treatment is performed in an atmosphere containing chlorine in addition to oxygen and nitrogen. Making the oxide film include a halogen element in this manner provides the effect of fixing impurity elements such as heavy metal in the oxide film to suppress adverse effects on the semiconductor properties.

The structure described in this embodiment can be used in appropriate combination with the structures described in other embodiments.

(Embodiment 3)

<Process of Manufacturing SOI Substrate>

In Embodiment 3, examples of the method of manufacturing an SOI substrate are described with reference to drawings.

Note that parts that are different from those of the above Embodiments 1 and 2 are detailed while the descriptions of the same parts as those of Embodiment 1 and 2 are omitted.

<First Mode>

To begin with, a manufacturing method according to First Mode is described with reference to FIGS. 4A to 4E.

Figure 4A:
FIGS. 4A, 4B-1 to 4B-3 and 4C to 4E are cross-sectional views illustrating an example of a method of manufacturing an SOI substrate.

First, the base substrate 100 is prepared (see FIG. 4A). As the base substrate 100, a light-transmitting glass substrate used for a liquid crystal display device or the like is available. As the glass substrate, a substrate having a strain point of 580° C. or more (preferably, 600° C. or more) may preferably be used. Further, the glass substrate is preferably a non-alkali glass substrate. The non-alkali glass substrate is formed using a glass material such as aluminosilicate glass, aluminoborosilicate glass, or barium borosilicate glass, for instance.

Note that as the base substrate 100, it is possible to use an insulating substrate such as a ceramic substrate, a quartz substrate, or a sapphire substrate, a substrate formed of a semiconductor such as silicon, a substrate formed of a conductor such as metal or stainless steel, or the like, as well as the glass substrate.

Figures 1, 4B:
Figures 2, 4B:
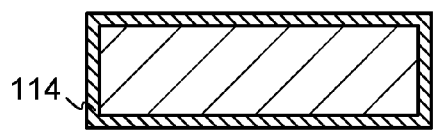

Next, the bond substrate 110 is prepared (see FIG. 4B-1). As the bond substrate 110, for example, a single crystal semiconductor substrate formed of a Group 14 element such as silicon, germanium, silicon germanium, or silicon carbide can be used.

Although there is no limitation on the size of the bond substrate 110, for example, a semiconductor substrate that is 8 inches (200 mm) in diameter, 12 inches (300 mm) in diameter, or 18 inches (450 mm) in diameter can be used. Alternatively, a round semiconductor substrate processed into a rectangular shape may be used.

Next, the insulating layer 114 is formed on the bond substrate 110 (see FIG. 4B-2).

As the insulating layer 114, for instance, a silicon oxide film, a silicon oxynitride film, a silicon nitride film, a silicon nitride oxide film, or the like can be used. These films can be formed by a thermal oxidation method, a CVD method, a sputtering method, or the like. When a CVD method is employed to form the insulating layer 114, use of a silicon oxide film formed using organosilane, such as tetraethoxysilane (abbreviation: TEOS) (chemical formula: $Si(OC_2H_5)_4$), as the insulating layer 114 is preferable in terms of productivity.

In this embodiment, by subjecting the bond substrate 110 to a thermal oxidation treatment, the insulating layer 114 (here, a silicon oxide film) is formed. The thermal oxidation treatment is preferably performed in an oxidizing atmosphere to which halogen is added. For example, the bond substrate 110 is subjected to the thermal oxidation treatment in an oxidizing atmosphere to which chlorine (Cl) is added, thereby forming the insulating layer 114 oxidized with HCl. Accordingly, the insulating layer 114 includes chlorine atoms.

Note that although the insulating layer 114 has a single-layer structure in this embodiment, it may have a stack structure. Further, when the insulating layer 114 is not necessarily provided, for example, when there is no particular problem with the bond, a structure in which the insulating layer 114 is not provided may be employed.

Figures 3, 4B:
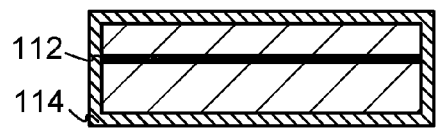

Next, the bond substrate 110 is irradiated with ions, thereby forming the embrittlement region 112 (see FIG. 4B-3). More specifically, for example, an ion beam including ions accelerated by an electric field is delivered to form the embrittlement region 112 at a certain depth from a surface of the bond substrate 110. Accelerating energy of the ion beam or the incidence angle thereof controls the depth at which the embrittlement region 112 is formed. In other words, the embrittlement region 112 is formed in a region at a depth the same or substantially the same as the average penetration depth of the ions. Here, the depth at which the embrittlement region 112 is formed is preferably uniform in the entire surface of the bond substrate 110.

Further, the depth at which the above-described embrittlement region 112 is formed determines the thickness of the semiconductor layer which is to be split from the bond substrate 110. The depth at which the embrittlement region 112 is formed is greater than or equal to 50 nm and less than or equal to 1 μm, preferably greater than or equal to 50 nm and less than or equal to 300 nm, from the surface of the bond substrate 110.

In the addition of ions to the bond substrate 110, an ion implantation apparatus or an ion doping apparatus can be used. With an ion implantation apparatus, a source gas is excited to generate ion species, the generated ion species are mass-separated, and the object to be processed is irradiated with the ion species having a certain mass. With an ion doping apparatus, a process gas is excited to produce ion species, and the object to be processed is irradiated with the generated ion species that are not mass-separated. Note that in an ion doping apparatus provided with a mass separator, ion irradiation involving mass separation can also be performed as in the ion implantation apparatus.

When an ion doping apparatus is used, a process of forming the embrittlement region 112 can be performed, for example, under the following conditions:

Accelerating voltage: greater than or equal to 10 kV and less than or equal to 100 kV (preferably, greater than or equal to 30 kV and less than or equal to 80 kV)

Dose: greater than or equal to $1\times10^{16}/cm^2$ and less than or equal to $4\times10^{16}/cm^2$ Beam current density: greater than or equal to 2 μA/$cm^2$ (preferably, greater than or equal to 5 μA/$cm^2$, more preferably, greater than or equal to 10 μA/$cm^2$)

When an ion doping apparatus is used, a gas containing hydrogen can be used as the source gas. By using a gas containing hydrogen, $H^+$, $H_2^+$, and $H_3^+$ can be generated as ion species. When a hydrogen gas is used as the source gas, the number of $H_3^+$ ions with which the irradiation is performed is preferably large. Specifically, in an ion beam, the proportion of $H_3^+$ ions in the total of $H^+$, $H_2^+$, and $H_3^+$ ions is preferably 70% or more. More preferably, the proportion of $H_3^+$ ions is 80% or more. The thus increase in the proportion of $H_3^+$ ions enables the hydrogen concentration in the embrittlement region 112 to be $1\times10^{20}$ atoms/$cm^3$ or more. This facilitates split at the embrittlement region 112. Furthermore, the irradiation with a large number of $H_3^+$ ions, the embrittlement region 112 can be formed in a shorter period of time as compared with the case of irradiation with $H^+$ ions and $H_2^+$ ions. Moreover, the use of $H_3^+$ ions can reduce the average penetration depth of ions; thus, the embrittlement region 112 can be formed at a shallow region.

When an ion implantation apparatus is used, preferably, the irradiation with $H_3^+$ ions is performed by mass separation. It is needless to say that irradiation with $H^+$ or $H_2^+$ ions may be performed. Note that since the use of an ion implantation apparatus involves selection of ion species to perform irradiation, ion irradiation efficiency could be decreased compared to the case where an ion doping apparatus is used.

As the source gas for the ion irradiation step, as well as a gas containing hydrogen, it is possible to use one or more kinds of gases selected from a rare gas of helium, argon, or the like, a halogen gas typified by a fluorine gas or a chlorine gas, and a halogen compound gas such as a fluorine compound gas (e.g., $BF_3$). When helium is used for the source gas, an ion beam having a high proportion of He$^+$ ions can be produced without mass separation. Use of such an ion beam can realize efficient formation of the embrittlement region 112.

Further, the embrittlement region 112 can be formed through the ion irradiation divided into plural steps. In this case, a different source gas may be used in each ion irradiation, or the same source gas may be used. For example, after ion irradiation is performed using a rare gas as a source gas, further ion irradiation can be performed using a gas containing hydrogen as a source gas. Also, ion irradiation is performed first using a halogen gas or a halogen compound gas, and then ion irradiation can be performed using a gas containing hydrogen.

Figure 4C:
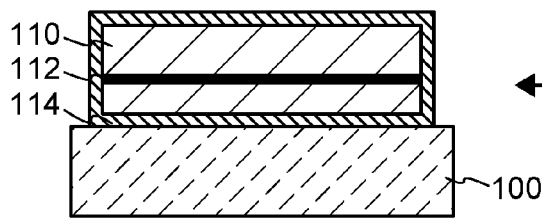

Next, the base substrate 100 and the bond substrate 110 are bonded (see FIG. 4C). Specifically, the base substrate 100 and the bond substrate 110 are bonded to each other with the insulating layer 114 therebetween. After the surface of the base substrate 100 is in contact with the surface of the insulating layer 114, a pressure treatment realizes the bond between the base substrate 100 and the bond substrate 110. Note that as the mechanism of the bond, a mechanism related to van der Waals' force, a mechanism related to hydrogen bonding, or the like is considered.

Note that before the bond between the bond substrate 110 and the base substrate 100, at least one of the base substrate 100 and the insulating layer 114 formed on the bond substrate 110 is preferably subjected to a plasma treatment. The plasma treatment for at least one of the insulating layer 114 and the base substrate 100 contributes to an increase in hydrophilic groups or an improvement of planarity. Accordingly, the bond strength between the bond substrate 110 and the base substrate 100 can be enhanced.

Here, when capacitively coupled plasma is used, the plasma treatment is performed using plasma generated by introducing an inert gas (such as an Ar gas) into a chamber in a vacuum state and applying a high-frequency voltage between an electrode provided with the substrate to be processed (e.g., the base substrate 100 or the bond substrate 110) and the counter electrode. Since electrons and Ar cations are present in the plasma and a self bias is generated on the surface of the substrate to be processed, the Ar cations are accelerated to the substrate to be processed side. By collision of the accelerated Ar cations with the surface of the base substrate 100, the surface of the base substrate 100 is etched by sputtering. At this time, a projection of the surface of the base substrate 100 is preferentially etched by sputtering; thus, the planarity of the surface of the base substrate 100 can be improved. Further, by the accelerated Ar cations, impurities such as organic substances on the base substrate 100 can be removed and the base substrate can be activated. Alternatively, the plasma treatment can be performed using plasma generated by introducing a reactive gas (e.g., an O$_2$ gas or an N$_2$ gas) as well as an inert gas into a chamber in a vacuum state and applying a high-frequency voltage. When the reactive gas is introduced, it is possible to repair defects caused by etching of the surface of the base substrate 100 using sputtering.

In this embodiment, the plasma treatment is performed using an argon gas by an inductively coupled plasma (ICP) method. Specifically, the treatment with argon plasma may be performed under conditions where the ICP power is 100 to 3000 W, the pressure is 0.1 to 5.0 Pa, the gas flow rate is 5 to 2000 sccm, and the RF bias voltage is 75 to 300 W. The following are more specific conditions: the ICP power is 500 W (0.11 W/cm$^2$), the pressure is 1.35 Pa, the gas flow rate is 100 sccm, and the RF bias voltage is 100 W (0.61 W/cm$^2$).

After the bond substrate 110 and the base substrate 100 are bonded to each other, the bond substrate 110 and base substrate 100 that are bonded may preferably be subjected to a heat treatment so that the bond is strengthened. The heat temperature at this time is preferably a temperature at which the split at the embrittlement region 112 does not proceed. For example, the temperature is set to lower than 400° C., preferably less than or equal to 300° C. There is no particular limitation on the length of the time for the heat treatment, which may be optimally set as appropriate depending on the relationship between the treatment time and the bond strength. For instance, the heat treatment can be performed at 200° C. for 2 hours. Further, only the region that is used for the bond can be locally heated by irradiation with microwaves or the like. When there is no problem with the bond strength, the above heat treatment may be omitted.

Figure 4D:
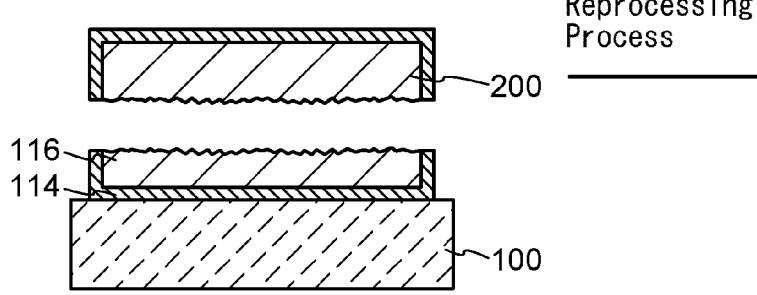

Next, the bond substrate 110 is split into the semiconductor layer 116 and the bond substrate 200 at the embrittlement region 112 (see FIG. 4D). The split of the bond substrate 110 may preferably be performed by a heat treatment. The temperature for the heat treatment can be set based on the upper temperature limit of the base substrate 100. For instance, when a glass substrate is used as the base substrate 100, the temperature for the heat treatment is preferably set to greater than or equal to 400° C. and less than or equal to 750° C. However, as long as the glass substrate can withstand the temperature greater than this range, the temperature is not limited thereto. Note that in this embodiment, the heat treatment is performed at 600° C. for 2 hours.

The above heat treatment causes a change in the volume of microvoids formed in the embrittlement region 112, resulting in generation of a crack in the embrittlement region 112. As a result, the bond substrate 110 is split along the embrittlement region 112. Accordingly, the semiconductor layer 116 split from the bond substrate 110 remains over the base substrate 100. Further, since the interface for bonding the substrate 110 and the base substrate 100 is heated by this heat treatment, a covalent bond is formed at the interface, so that the bond strength can be further enhanced.

There are defects caused by the split step or the ion irradiation step on a surface of the semiconductor layer 116 formed as described above, and the planarity of the surface is impaired. Therefore, a treatment for reducing the defects on the semiconductor layer 116 or a treatment for improving the surface planarity of the semiconductor layer 116 may preferably be performed.

In this embodiment, for example, irradiating the semiconductor layer 116 with laser light can realize the reduction in defects and the improvement of the planarity of the semiconductor layer 116. Irradiating the semiconductor layer 116 with laser light makes the semiconductor layer 116 melt so that the semiconductor layer 116 cools and solidifies, resulting in formation of a single crystal semiconductor layer in which the defects are reduced and the surface planarity is improved.

Further, a thinning step for decreasing the thickness of the single crystal semiconductor layer may be carried out. To thin the semiconductor layer, either a dry etching treatment, or a wet etching treatment, or a combination of both may be performed. For example, when the semiconductor layer is formed of silicon, the semiconductor layer can be thinned using SF$_6$ and O$_2$ as process gases by a dry etching treatment.

Figure 4E:
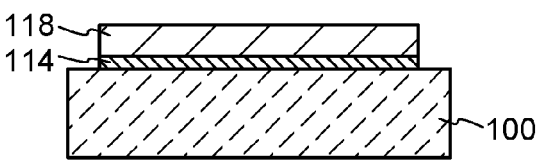

As described above, the semiconductor layer 118 can be formed over the base substrate 100 (see FIG. 4E).

Note that although the case where the laser light irradiation precedes the etching treatment in this embodiment, one embodiment of the present invention is not limited thereto: the etching treatment may be performed before the laser light irradiation, or both before and after the laser light irradiation.

Note that although laser light is used to realize the reduction in defects and the improvement of the planarity in this embodiment, one embodiment of the present invention is not limited thereto. The reduction in defects and improvement of the planarity may be realized by using any other method such as a heat treatment. Further, if a treatment for a defect reduction is unnecessary, a treatment for improving planarity, such as an etching treatment, may be employed alone.

Note that the split bond substrate 200 becomes a reprocessed bond substrate through a reprocessing process, and can be reused. Since there are defects on a surface of the split bond substrate 200 due to the embrittlement region 112 or the like, such defects may preferably be removed before the reprocessing process. Accordingly, the reprocessing process can be carried out more successfully. As methods of the removal, there are an etching treatment and a polishing treatment such as CMP.

<Second Mode>

Next, a manufacturing method according to Second Mode is described with reference to FIGS. 5A to 5E. Second Mode is different from First Mode in that the insulating layer 101 is formed over the base substrate 100. Therefore, this point is mainly described below.

First, the base substrate 100 is prepared (see FIG. 5A-1), and the insulating layer 101 is formed over the base substrate (see FIG. 5A-2). Refer to FIG. 4A for the base substrate 100.

There is no particular limitation on the method of forming the insulating layer 101, to which a sputtering method, a plasma CVD method, or the like can be applied, for example. Since the insulating layer 101 has a surface for the bond, the insulating layer 101 is preferably formed such that this surface has high planarity. The insulating layer 101 can be formed using one or more materials selected from silicon oxide, silicon nitride, silicon oxynitride, silicon nitride oxide, aluminum oxide, aluminum nitride, aluminum oxynitride, aluminum nitride oxide, and the like. For example, when silicon oxide is used for the insulating layer 101, formation using an organosilane gas by a chemical vapor deposition method enables the insulating layer 101 to have excellent planarity. Note that although the insulating layer 101 has a single-layer structure in this embodiment, it may have a stack structure.

Next, the bond substrate 110 is prepared, and the insulating layer 114 is formed on the surface of the bond substrate 110. The bond substrate 110 is irradiated with ions, whereby the embrittlement region 112 is formed (see FIG. 5B-1 to FIG. 5B-3). The steps of FIG. 5B-1 to FIG. 5B-3 are the same as those of FIG. 4B-1 to FIG. 4B-3, and therefore details thereof are omitted.

Then, the base substrate 100 and the bond substrate 110 are bonded to each other (see FIG. 5C). Specifically, the base substrate 100 and the bond substrate 110 are bonded to each other with the insulating layer 101 and the insulating layer 114 therebetween. Through a pressure treatment after the surface of the insulating layer 101 is in contact with the surface of the insulating layer 114, the base substrate 100 and the bond substrate 110 are bonded to each other.

Note that before the bond between the bond substrate 110 and the base substrate 100, it is preferable to subject the bond substrate 110, the insulating layer 114 formed on the bond substrate 110, the base substrate 100, or the insulating layer 101 formed on the base substrate 100 to a surface treatment. The surface treatment can improve the bond strength at the bond interface between the bond substrate 110 and the base substrate 100.

As examples of the surface treatment, a wet treatment, a dry treatment, and a combination of both are given. Alternatively, a combination of different wet treatments or a combination of different dry treatments may be employed.

Examples of the wet treatment include an ozone treatment using ozone water (ozone water cleaning), megasonic cleaning, two-fluid cleaning (a method in which functional water such as pure water or hydrogenated water and a carrier gas such as nitrogen are sprayed together), and the like. Examples of the dry treatment include an ultraviolet treatment, an ozone treatment, a plasma treatment, a plasma treatment with bias application, a radical treatment, and the like. The surface treatment as described above has the effect of improving hydrophilicity and cleanliness of a surface of the object to be processed (i.e., the single crystal semiconductor substrate, the insulating layer formed on the single crystal semiconductor substrate, the base substrate, or the insulating layer formed on a base substrate). As a result, the bond strength between the substrates can be improved.

The wet treatment is effective for the removal of macro dust and the like adhering to a surface of the object to be processed. The dry treatment is effective for the removal or decomposition of micro dust such as an organic substance which adheres to a surface of the object to be processed. Here, it is preferable that the wet treatment such as cleaning be performed after the dry treatment such as an ultraviolet treatment, because, in this case, the surface of the object to be processed can be made clean and hydrophilic and generation of watermarks on the surface can be suppressed.

Alternatively, it is preferable to perform a surface treatment using ozone or oxygen in an active state such as singlet oxygen. Ozone or oxygen in an active state such as singlet oxygen enables effective removal or decomposition of organic substances adhering to the surface of the object to be processed. Further, by use of ozone or oxygen in an active state such as singlet oxygen in combination with light having a wavelength less than 200 nm, which is an ultraviolet ray to perform the treatment, the removal of organic substances adhering to the surface of the object to be processed can be made more effective. Specific description thereof is made below.

For example, the surface treatment of the object to be processed is performed by irradiation with ultraviolet light in an atmosphere containing oxygen. By irradiation with light having a wavelength less than 200 nm and light having a wavelength of 200 nm or more, which are ultraviolet rays, in an atmosphere containing oxygen, singlet oxygen as well as ozone can be generated. Alternatively, by irradiation with light having a wavelength less than 180 nm, which is an ultraviolet ray, singlet oxygen as well as ozone can be generated.

An example of a reaction caused by the irradiation with light having a wavelength less than 200 nm and light having a wavelength of 200 nm or more in an atmosphere containing oxygen is described.

$$O_2 + h\nu(\lambda_1 \text{ nm}) \rightarrow O(^3P) + O(^3P) \quad (1)$$

$$O(^3P) + O_2 \rightarrow O_3 \quad (2)$$

$$O_3 + h\nu(\lambda_2 \text{ nm}) \rightarrow O(^1D) + O_2 \quad (3)$$

In the above reaction formula (1), by irradiation with light (hν) having a wavelength less than 200 nm ($\lambda_1$ nm) in an atmosphere containing oxygen ($O_2$), oxygen atoms in a ground state ($O(^3P)$) are generated. Next, in the reaction formula (2), the oxygen atoms in a ground state ($O(^3P)$) and the oxygen ($O_2$) are reacted to generate ozone ($O_3$). Then, in the reaction formula (3), by irradiation with light having a wavelength of 200 nm or more ($\lambda_2$ nm) in an atmosphere containing the generated ozone ($O_3$), singlet oxygen $O(^1D)$ in an excited state is generated. In an atmosphere containing oxygen, the irradiation with light having a wavelength less than 200 nm, which is an ultraviolet ray, results in the generation of ozone, and the irradiation with light having a wavelength of 200 nm or more results in the generation of singlet oxygen by decomposition of the ozone. The surface treatment as described above can be performed by, for example, irradiation using a low-pressure mercury lamp ($\lambda_1$=185 nm, $\lambda_2$=254 nm) in an atmosphere containing oxygen.

Further, an example of a reaction caused by the irradiation with light having a wavelength less than 180 nm in an atmosphere containing oxygen is described.

(4)

(5)

(6)

In the above reaction formula (4), by irradiation with light having a wavelength less than 180 nm ($\lambda_3$ nm) in an atmosphere containing oxygen ($O_2$), singlet oxygen in an excited state $O(^1D)$ and oxygen atoms in a ground state ($O(^3P)$) are generated. Next, in the reaction formula (5), the oxygen atoms ($O(^3P)$) in a ground state and the oxygen ($O_2$) are reacted to generate ozone ($O_3$). In the reaction formula (6), by irradiation with light having a wavelength less than 180 nm ($\lambda_3$ nm) in an atmosphere containing the generated ozone ($O_3$), singlet oxygen in an excited state and oxygen are generated. In an atmosphere containing oxygen, the irradiation with light having a wavelength less than 180 nm, which is an ultraviolet ray, results in the generation of ozone and, by decomposition of the ozone or oxygen, singlet oxygen can be generated. The surface treatment as described above is performed by, for example, irradiation using a Xe excimer UV lamp in an atmosphere containing oxygen.

The light having a wavelength less than 200 nm causes breakage of a chemical bond in an organic substance and the like adhering to the surface of the object to be processed. With ozone or singlet oxygen, an organic substance adhering to the surface of the object or the organic substance in which the chemical bond is broken is removed by oxidative-decomposition. The surface treatment as described above can enhance the hydrophilicity and cleanliness of the surface of the object to be processed, making the bond more preferable.

Although the surface treatment is performed before the base substrate 100 is bonded to the bond substrate 110 in Second Mode, one embodiment of the present invention is not limited thereto. The surface treatment may be replaced with the plasma treatment described in First Mode or combined with the plasma treatment. Note that in First Mode, the plasma treatment may be replaced with the surface treatment described in Second Mode or combined with the plasma treatment.

Next, the bond substrate 110 is split into the semiconductor layer 116 and the semiconductor substrate 200 at the embrittlement region 112 (see FIG. 5D). Accordingly, the semiconductor layer 116 remains over the base substrate 100. After that, the treatment of reducing defects, the treatment of improving the surface planarity, or the like enables formation of the semiconductor layer 118 over the base substrate 100 (see FIG. 5E). Note that the steps of FIGS. 5D and 5E can be performed in the same way as those of FIGS. 4D and 4E, and therefore details thereof are omitted.

Note that the split bond substrate 200 becomes a reprocessed bond substrate through a reprocessing process, and can be reused. Since there are defects on a surface of the bond substrate 200 due to the embrittlement region 112 or the like, such defects may preferably be removed before the reprocessing process. Accordingly, the reprocessing process can be carried out more successfully. As methods of the removal, there are an etching treatment and a polishing treatment such as CMP.

An embodiment of the disclosed invention enables formation of a reprocessed bond substrate with reduced oxygen defects or impurity elements, thereby improving the properties of an SDI substrate manufactured using this reprocessed bond substrate. Further, deterioration of the properties of a bond substrate can be suppressed, and therefore the number of times of repeated use of the bond substrate increases. This can further suppress manufacturing costs of an SOI substrate.

Thus, an embodiment of the disclosed invention can prevent malfunction of the bond substrate which is caused by its repeated use.

This application is based on Japanese Patent Application serial no. 2009-104203 filed with Japan Patent Office on Apr. 22, 2009, the entire contents of which are hereby incorporated by reference.

What is claimed is:

1. A method of manufacturing an SOI substrate, comprising:
    a first step of subjecting a bond substrate to a first heat treatment in an argon atmosphere and then a second heat treatment in an atmosphere of a mixture of oxygen and nitrogen;
    a second step of forming an embrittlement region in the bond substrate by irradiating the bond substrate with ions;
    a third step of bonding the bond substrate to a base substrate with an insulating layer therebetween;
    a fourth step of splitting the bond substrate at the embrittlement region to form a semiconductor layer over the base substrate with the insulating layer therebetween;
    a fifth step of repeating the steps from the second step to the fourth step n times after the first step is performed once, wherein n is a natural number greater than or equal to 2; and
    a sixth step of subjecting the bond substrate to a third heat treatment in an argon atmosphere and then a fourth heat treatment in an atmosphere of a mixture of oxygen and nitrogen after the fifth step,
    wherein the insulating layer comprises a metal element.

2. The method of manufacturing an SOI substrate according to claim 1,
    wherein an oxide film formed on a surface of the bond substrate in the second heat treatment is used as the insulating layer in bond to the base substrate.

3. The method of manufacturing an SOI substrate according to claim 1,
    wherein a concentration of the oxygen in the second heat treatment is less than 5 vol. %.

4. The method of manufacturing an SOI substrate according to claim 1,
    wherein the atmosphere during the second heat treatment includes chlorine in addition to the oxygen and the nitrogen.

5. The method of manufacturing an SOI substrate according to claim 1,
    wherein the argon atmosphere includes argon and hydrogen.

6. The method of manufacturing an SOI substrate according to claim 1,
    wherein an oxygen included in the bond substrate is reduced by the first heat treatment.

7. A method of manufacturing an SOI substrate, comprising:
- a first step of subjecting a bond substrate to a first heat treatment in an argon atmosphere and then a second heat treatment in an atmosphere of a mixture of oxygen and nitrogen;
- a second step of forming an embrittlement region in the bond substrate by irradiating the bond substrate with ions;
- a third step of bonding the bond substrate to a base substrate with an insulating layer therebetween;
- a fourth step of splitting the bond substrate at the embrittlement region to form a semiconductor layer over the base substrate with the insulating layer therebetween;
- a fifth step of repeating the steps from the second step to the fourth step n times after the first step is performed once, wherein n is a natural number greater than or equal to 2;
- a sixth step of subjecting the bond substrate to a third heat treatment in an argon atmosphere and then a fourth heat treatment in an atmosphere of a mixture of oxygen and nitrogen after the fifth step; and
- a seventh step of repeating the steps from the second step to the fourth step at least once after the sixth step.

8. The method of manufacturing an SOI substrate according to claim 7,
wherein an oxide film formed on a surface of the bond substrate in the second heat treatment is used as the insulating layer in bond to the base substrate.

9. The method of manufacturing an SOI substrate according to claim 7,
wherein a concentration of the oxygen in the second heat treatment is less than 5 vol. %.

10. The method of manufacturing an SOI substrate according to claim 7,
wherein the atmosphere during the second heat treatment includes chlorine in addition to the oxygen and the nitrogen.

11. The method of manufacturing an SOI substrate according to claim 7,
wherein the argon atmosphere includes argon and hydrogen.

12. The method of manufacturing an SOI substrate according to claim 7,
wherein an oxygen included in the bond substrate is reduced by the first heat treatment.

13. A method of manufacturing an SOI substrate, comprising:
- a first step of subjecting a bond substrate to a first heat treatment in an argon atmosphere and then a second heat treatment in an atmosphere of a mixture of oxygen and nitrogen;
- a second step of forming an embrittlement region in the bond substrate by irradiating the bond substrate with ions;
- a third step of bonding the bond substrate to a base substrate with an insulating layer therebetween;
- a fourth step of splitting the bond substrate at the embrittlement region to form a semiconductor layer over the base substrate with the insulating layer therebetween;
- a fifth step of repeating the steps from the second step to the fourth step n times after the first step is performed once, wherein n is a natural number greater than or equal to 2;
- a sixth step of polishing a surface of the bond substrate after the fifth step;
- a seventh step of subjecting the bond substrate to a third heat treatment in an argon atmosphere and then a fourth heat treatment in an atmosphere of a mixture of oxygen and nitrogen after the sixth step; and
- an eighth step of repeating the steps from the second step to the fourth step at least once after the seventh step.

14. The method of manufacturing an SOI substrate according to claim 13,
wherein an oxide film formed on the surface of the bond substrate in the second heat treatment is used as the insulating layer in bond to the base substrate.

15. The method of manufacturing an SOI substrate according to claim 13,
wherein a concentration of the oxygen in the second heat treatment is less than 5 vol. %.

16. The method of manufacturing an SOI substrate according to claim 13,
wherein the atmosphere during the second heat treatment includes chlorine in addition to the oxygen and the nitrogen.

17. The method of manufacturing an SOI substrate according to claim 13,
wherein the argon atmosphere includes argon and hydrogen.

18. The method of manufacturing an SOI substrate according to claim 13,
wherein an oxygen included in the bond substrate is reduced by the first heat treatment.

19. The method of manufacturing an SOI substrate according to claim 1,
wherein the metal element is selected from the group consisting of copper, iron, and nickel.

20. The method of manufacturing an SOI substrate according to claim 1,
wherein the semiconductor layer is subjected to a polishing treatment after the fourth step.

21. The method of manufacturing an SOI substrate according to claim 7,
wherein the semiconductor layer is subjected to a polishing treatment after the fourth step.

22. The method of manufacturing an SOI substrate according to claim 13,
wherein the semiconductor layer is subjected to a polishing treatment after the fourth step.

* * * * *